March 23, 1954 E. WATKINSON 2,673,255
VOLUME CONTROL ARRANGEMENT FOR RADIO RECEIVERS
Filed Aug. 7, 1951
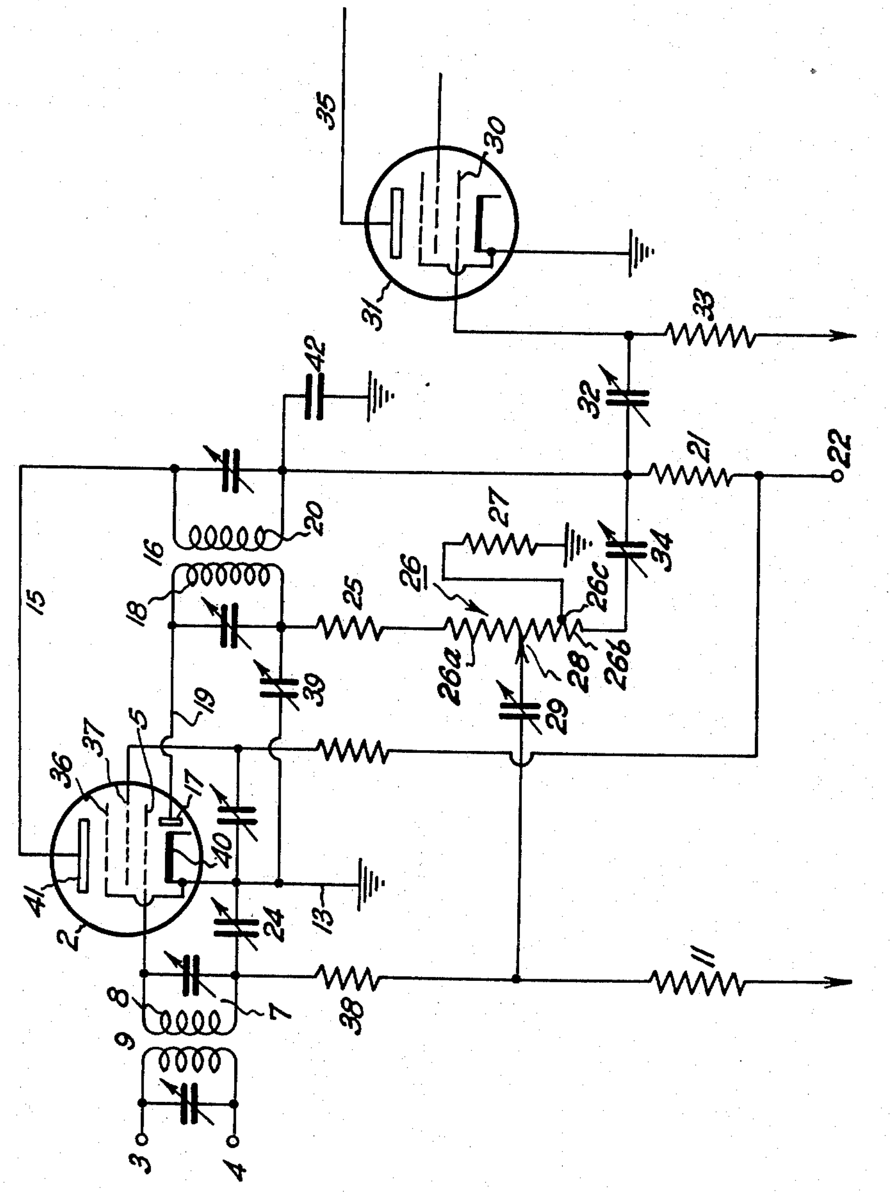
Inventor
E. Watkinson
By Glascock Downing & Seebold
Attys.

Patented Mar. 23, 1954

2,673,255

UNITED STATES PATENT OFFICE 2,673,255

VOLUME CONTROL ARRANGEMENT FOR RADIO RECEIVERS

Eric Watkinson, Denistone, near Sydney, New South Wales, Australia, assignor to Amalgamated Wireless (Australasia) Limited, Sydney, New South Wales, Australia, a corporation of New South Wales Application August 7, 1951, Serial No. 240,742

Claims priority, application Australia September 27, 1950

2 Claims. (Cl. 179—171)

The present invention relates to volume control in radio receivers and more particularly to volume control arrangements for use in radio receivers of the reflex type.

In order to control the output volume level from a radio receiver, it has been customary to provide a manually operable volume control for varying the amplitude of the audio frequency amplifier. In certain types of receiver circuits, such as for example the reflex type, this method of volume control is unsatisfactory.

In this latter type of receiver circuit, wherein the signal is amplified both before and after rectification, it is only possible to obtain zero output at zero audio input to the reflexed amplifier valve when the latter exhibits perfect linear characteristics.

This desirable operating condition, however, is not readily obtainable in practice as there usually exists a certain amount of non-linearity in the mutual conductance characteristic of the reflexed amplifying valve, which non-linearity introduces undesirable effects into the operation of the receiver. The most noticeable defects are inability to control the output volume to zero and very marked increase in distortion as the receiver output volume level is reduced.

When operating over a non-linear mutual conductance characteristic, a modulated carrier frequency input to the reflexed amplifying valve produces audio frequency as well as carrier frequency currents in the anode circuit. In a reflexed amplifier the audio frequency currents thus produced must flow through the anode load resistor thereby building up voltages thereacross which are passed directly to the following amplifying valve. In this way the undesired audio frequency potentials resulting from the non-linear characteristics of the amplifying valve produce an audio output independent of the setting of the volume control associated with the audio frequency input to the reflexed valve. This becomes particularly noticeable when the volume control is turned completely "off" and is therefore termed the "minimum volume output," or "playthrough."

Various arrangements have previously been suggested, for overcoming this undesirable characteristic in receivers of the type referred to, but none of these prior art arrangements have been entirely satisfactory—they all have some disadvantage which limits the scope of their practical utility.

Probably the most successful of these prior art arrangements is that disclosed in Australian Patent No. 113,491, dated July 26, 1940. The specification of this patent describes a volume control circuit arrangement wherein control of the reflexed signal in the reflex stage, and of the signal input to an amplifying stage following the reflex stage, is effected by means of ganged potentiometers.

Although this arrangement provides a satisfactory reduction in the minimum volume or playthrough, the additional components required to carry it into effect make it too costly for general use.

In another well known circuit, for the reduction of playthrough, negative voltage feedback, over the reflexed and output stages, is applied to the low potential end of the diode load resistance which is also the volume control. With this circuit the amount of negative feedback is increased as the volume control approaches its minimum setting so that the audio frequency gain—and consequently the playthrough—is considerably reduced with the control at zero.

There is, however, a limit to the amount of playthrough reduction that can be obtained with this circuit because, as the amount of negative feedback is increased, peaks appear in the response of the audio frequency amplifier, according to well-known feedback theory, and with a further increase in the degree of feedback actual oscillation will occur. At high frequencies the maximum possible phase shift in a typical embodiment of the circuit, with the volume control set at zero, is 360 degrees and because of the large possible phase shift a high frequency peak occurs in the audio frequency response with comparatively small amounts of negative feedback, say, about 14 db. This peak gives a very objectionable character to the playthrough. For this reason the amount of mid-frequency negative feedback—and hence the playthrough reduction—available with this type of circuit is limited.

The object of the present invention is to provide an improved volume control circuit arrangement for radio receivers of the type referred to, in which the disadvantages associated with prior art devices of this general class are avoided.

A further object of the present invention is to provide an improved volume control circuit which provides a much greater reduction in the minimum volume or playthrough in reflex type receivers than has been possible in the past.

The above objects are achieved, in accordance with the present invention, in a radio receiver having volume control means for controlling the amount of signal voltage supplied to the input of the audio frequency amplifier, by applying degenerative feedback voltage from the output of the first stage of said amplifier to said volume control means so that during adjustment of said control means from its maximum setting towards its minimum control setting, the amplitude of the signal voltage applied to the input of said amplifier is varied from a maximum to a predetermined minimum value, through a range of variation less than the full range of variation of said control means, and so that during further adjustment of said control means in the direction of minimum control setting, said amplitude of said predetermined value will remain substantially unchanged and the control means functions to apply an increasing amount of degenerative feedback to the input of said amplifier.

For a more complete understanding of the invention and the manner in which it is to be carried out, attention is now directed to the following description with reference to the accompanying drawing which illustrates diagrammatically one practical exemplification of the present invention as applied to a reflex receiver.

Referring to the aforesaid drawing; signal-modulated carrier frequency energy is applied to the terminals 3, 4 coupled to the control grid 5 of the amplifier section of valve 2 through a carrier frequency input circuit 7. The latter circuit includes a suitable radio frequency input impedance or coupling device, such as the tuned secondary 8 of the coupling transformer 9. The control grid 5 of the valve 2 receives a suitable biassing potential through this circuit, and through a low potential supply lead connected to a suitable source of biassing potential (not shown) through coupling resistors 11, 38.

A suitable carrier frequency bypass for the circuit 7, directly to the cathode lead 13, is provided by the condenser 24. The input circuit 7 is tuned to the carrier frequency of the incoming signal, such as for example the selected intermediate frequency (I. F.) in a superheterodyne receiver, or the carrier wave frequency in a tuned radio frequency type of receiver.

The high frequency or I. F. signals delivered to the control grid 5 from the input circuit 7 are amplified in the amplifier section of the valve 2, and the amplified carrier frequency signals appearing in the anode circuit 15 are passed through a coupling device 16 to the carrier frequency rectifier 17, 40. In the present example, the valve 2 is shown as a multiple valve of well-known type containing, within a single envelope, an amplifier section comprising the cathode 40, the control grid 5, the screen grid 37, the suppressor grid 36 and the main anode 41, and a rectifier section comprising one or more independent diode anodes 17. The diode anode or anodes is or are disposed adjacent a portion of the cathode 40.

Although the above mentioned amplifier and rectifier sections are shown as being housed within a single envelope, it is to be clearly understood that separate valves may be used if desired, and that any suitable form of rectifier other than a diode may be employed without affecting the scope of the invention.

The coupling device 16 may consist of an I. F. transformer in the amplifier output circuit 15, and having a secondary 18 connected to a lead 19 in the diode rectifier circuit. The low potential side of the primary 20 of transformer 16 is connected, through the anode load resistor 21, to the positive terminal 22 of a suitable direct current potential supply source (not shown). A suitable bypass condenser 42 is provided between the low potential end of primary 20 and earth.

The low potential side of the secondary 18 is connected through the diode load resistance comprising a filter resistor 25, the high resistance portion 26*a* of volume control potentiometer 26, tapped at 26*c*, and the stopper resistor 27, to the common cathode lead 13. The moving contact 28 of the volume control potentiometer resistor 26 is connected, through a coupling condenser 29 and the filter resistor 38, to the low potential end of the input secondary 8 between the latter and the carrier frequency bypass capacitor 24. Carrier components are bypassed to the cathode in the rectifier output circuit by the capacitor 39.

From the description of the drawing thus far it will be seen that modulated H. F. or I. F. energy applied to the input terminals 3, 4 is amplified, the amplified energy appearing in the output circuit 15 being rectified in the rectifier 17, 40, and the audio frequency potentials developed across a portion (25, 26*a*, 27) of the rectifier output circuit being applied in controllable amplitude (via moving contact 28, condenser 29 and resistor 38) to the input circuit 7 of the amplifier 2. The audio frequency potentials are simultaneously amplified with the carrier potentials in the amplifier section of valve 2 and appear in amplified form across the anode load resistor 21.

Amplified audio frequency potentials, developed across the anode load resistor 21, are applied to the control grid 30 of an audio frequency amplifying valve 31 through a resistance capacity coupling network comprising the coupling capacitor 32 and the grid resistance 33. The low potential end of the grid resistance 33 is connected to a suitable source of biassing potential (not shown). The amplified audio frequency potentials appearing in the output lead 35 of the valve 31 may be applied, either directly or after still further amplification to a utilisation means (not shown). Although the valve 31 is shown as a pentode, it is to be understood that any suitable type of audio frequency amplifying valve may be employed. Further, the invention is not limited to the use of resistance coupling for transferring the amplified audio frequency potentials in the output of valve 2 to the input of valve 31. It is quite conceivable that transformer coupling may be desirable in some particular applications, and also that, instead of a single valve 31, a plurality of valves may be employed in the well-known parallel, or push-pull connections. These alternative coupling methods are well known to those skilled in the art, and consequently a detailed description thereof is considered unnecessary.

Suitable operating potentials are supplied to the anodes, screens and heaters of the valves 2 and 31 in any well-known manner from a suitable supply source or sources (not shown).

Portion of the audio frequency energy appearing in the output circuit 15 of the valve 2 is fed back to the input of the same valve, in degenerative sense, through a feedback circuit which includes, in accordance with the present invention, the low resistance section 26*b* (below tapping point 26*c*) of the volume control potentiometer 26.

The feedback connection is taken from the high potential end of the load resistance 21 through the capacitor 34 to the free end of the low resistance section 26b of the potentiometer 26.

Typical values for the components 26—26a—26b and 27 are, for example 500,000, 450,000, 50,000 and 2,000 ohms respectively. The values of 450,000 and 50,000 ohms for the sections 26a and 26b may be conveniently obtained by using a conventional 0.5 megohm potentiometer tapped at 50,000 ohms.

The action of the volume control arrangement of the present invention is unconventional in that, as the moving contact 28 is moved from the maximum volume setting (the free end of the high resistance section 26a of potentiometer 26) the output is reduced by the normal voltage divider effect until the ratio of the divider is, in the present example, about one to two hundred and fifty but, with a further decrease in the volume control setting, the voltage divider ratio remains substantially unchanged, whilst an increasing amount of negative feedback is applied to the grid of the valve 2.

As the negative feedback is obtained from the anode circuit of the valve to which it is to be applied, instead of being taken from the output circuit of the output valve of the amplifier as has been the practice in the past, the audio frequency output transformer, with a maximum possible H. F. phase shift of 180 degrees, is not included in the feedback loop. This overcomes the troubles previously experienced in prior art circuits, with H. F. peaks or H. F. oscillation. In consequence a much greater degree of play-through reduction may be obtained with the circuit arrangement of the present invention.

The resistor 27, in the circuit of the present invention, has a twofold function. Firstly, it completes the diode load and reduces the volume at the tap to a suitable level. That is to say, it insures that the audio frequency input to the valve 2 cannot be reduced to zero when the moving contact 28 of the volume control potentiometer 26 is adjusted to its minimum setting. It therefore follows that the desired output, across the anode load resistor 21, can never be completely cancelled by the undesired minimum volume effect which is always present in said load resistor. If the two outputs of fundamental frequency are almost balanced out, the final output consists mainly of the distortion voltages in the minimum voltage output, and the initial distortion percentage is therefore very high. As the audio input to valve 2, from the detector diode 17, 40, is increased, the distortion voltages become an increasingly smaller percentage of the total output and the distortion percentage therefore decreases. The value of the resistor 27 should be chosen so that, independent of the setting of the moving contact 28 of the volume control potentiometer 26, the desired audio level across the output load resistor 21 is always much greater than the undesired minimum volume output signal.

This results in considerable reduction in percentage of distortion present in the desired output.

The second function of the resistor 27 is to reduce the amount of gain reduction, due to feedback, at settings of the potentiometer contact 28 above the tap 26c. This is because the negative feedback is applied to a voltage divider consisting of section 26b of the potentiometer 26 and the resistor 27 in series. If the feedback were not reduced in this manner, excessive gain reduction would occur with the volume control at its maximum setting. With a circuit arrangement in accordance with the present invention, the gain reduction due to feedback is small for settings of the volume control potentiometer contact 28 above the tap 26c, but increases rapidly to a maximum when the moving contact 28 is moved past the tap 26c towards the minimum control setting of the volume control potentiometer 26.

Although the resistor 27 must not be too small, as discussed above, it also must not be too large. Below the tap 26c the moving contact 28 effects comparatively little volume reduction, due to voltage divider action, and the minimum volume reduction, due to negative feedback, is limited to the audio frequency gain of the reflexed stage (about 35 when using a 6AR7GT type valve) because the negative feedback cannot reduce the gain of the valve to less than unity. Thus if the resistor 27 is too large, the volume at the tap 26c may be too high to allow it to be reduced by feedback to a satisfactorily low level.

In practice, the resistor 27 is made as small as possible without making the action of the volume control too objectionable above the tap 26c.

Thus it will be seen that, as the potentiometer contact 28 is moved from maximum volume setting to the minimum volume setting, volume reduction above the tap 26c is principally due to the normal potential divider action of the potentiometer 26, but when the contact 28 is moved past the tap 26c, in the direction of minimum volume, gain control due to the potential divider effect remains at a comparatively constant value determined by the ratio of the resistance values of the resistors 27 and 26a, and the further reduction in output volume is due entirely to the rapidly increasing value of the negative feedback potentials applied to the grid of the valve 2.

Frequency compensated negative feedback from a voice coil, or from any other suitable source, may be applied simultaneously to the tap 26c on the volume control potentiometer 26 in any convenient manner if desired without affecting the operation of the invention.

At low frequencies an additional source of phase shift occurs in the screen bypassing network and with the potentiometer at its minimum setting, i. e. with the grid connected to the plate for A. C., and without the resistor 38, it is possible for low frequency oscillation to occur. The inclusion of a small impedance—the resistor 38—between grid and anode is sufficient to prevent this, and at the same time the resistor 38 and the capacitor 24 form a useful I. F. filter. Typical values for 38 and 24 might be 5000 ohms and 1000 mmf. respectively.

When the circuit of the present invention is used, it is possible, by suitably reducing the value of 38, to cause the valve 2 to oscillate at a low level and at a very low frequency or a very high frequency. This increases the bias on the valve 2 and reduces playthrough to substantially complete inaudibility without causing any other audible output from the receiver.

Although the invention has been described with respect to the specific circuit arrangement illustrated in the drawing, it is obvious that there are various alternative connections of coupling circuits in the diode load circuit, the input circuit and the output circuit, which may be employed without affecting the scope of the invention.

Moreover, although the description of the application of the invention has been given with respect to a reflex receiver, the invention is equally useful for the reduction of playthrough in other types of receivers in which feedback is taken from the plate circuit of the first audio frequency amplifier valve and applied to the low potential end of the volume control potentiometer as herein described.

I claim:

1. In a radio receiver, a volume control arrangement comprising an amplifying valve, means for applying modulated high frequency signal voltage to the input circuit of said valve, means for rectifying the energy appearing in the output circuit of said valve, means for applying, to the input circuit of said valve, audio-frequency signals developed across a portion of the output circuit of said rectifying means, a potentiometer having high and low resistance sections and a moving contact for manually varying the amplitude of the audio-frequency signal voltage applied to the input of said valve, said high resistance section being included in the output circuit of said rectifying means, and said amplitude varying from maximum to a predetermined minimum during the adjustment of said moving contact from one end of said high resistance section to a tapping point at the junction between said high and low resistance sections, means comprising a resistance connected between said tapping point and the cathode of said valve for preventing reduction to zero of said audio-frequency signal voltage by adjustment of said moving contact to said tapping point, and a feedback circuit connected to the end of said low resistance section remote from said tapping point for applying to the input circuit of said valve, in degenerative sense, and varying degree, a portion of the audio-frequency energy appearing in the output of said valve so that the amplitude of the feedback potentials increases as said moving contact is moved from said tapping point towards said end of said low resistance section.

2. In a radio receiver, a volume control arrangement according to claim 1, characterized in that said feedback potentials are taken from the high potential end of the audio-frequency load resistance in the output circuit of said valve and applied to said end of said low resistance section through a capacitor.

ERIC WATKINSON.

References Cited in the file of this patent

UNITED STATES PATENTS

| Number | Name | Date |
|---|---|---|
| 2,266,445 | Siegert et al. | Dec. 16, 1941 |
| 2,319,663 | Crowley | May 18, 1943 |
| 2,374,071 | Barton | Apr. 17, 1945 |
| 2,503,787 | Westerveld | Apr. 11, 1950 |
| 2,530,101 | Van Loon et al. | Nov. 14, 1950 |

FOREIGN PATENTS

| Number | Country | Date |
|---|---|---|
| 66,675 | Denmark | Apr. 26, 1948 |

OTHER REFERENCES

Radiotron Designer's Handbook, 3d ed., p. 183, pub. 1941, by RCA Mfg. Co., Harrison, N. J. (Copy in Div. 69.)